(12) United States Patent
Iacopi et al.

(10) Patent No.: US 7,964,479 B2
(45) Date of Patent: Jun. 21, 2011

(54) LOW-TEMPERATURE FORMATION OF LAYERS OF POLYCRYSTALLINE SEMICONDUCTOR MATERIAL

(75) Inventors: Francesca Iacopi, Leuven (BE); Philippe M. Vereecken, Liège (BE)

(73) Assignee: IMEC, Leuven (BE)

( * ) Notice: Subject to any disclaimer, the term of this patent is extended or adjusted under 35 U.S.C. 154(b) by 118 days.

(21) Appl. No.: 12/524,151

(22) PCT Filed: Feb. 19, 2008

(86) PCT No.: PCT/EP2008/052018
§ 371 (c)(1),
(2), (4) Date: Jul. 22, 2009

(87) PCT Pub. No.: WO2008/101931
PCT Pub. Date: Aug. 28, 2008

(65) Prior Publication Data
US 2011/0045662 A1 Feb. 24, 2011

Related U.S. Application Data

(60) Provisional application No. 60/890,573, filed on Feb. 19, 2007.

(51) Int. Cl.
*C23C 16/24* (2006.01)
*H01L 21/20* (2006.01)
*H01L 21/36* (2006.01)
*H01L 31/20* (2006.01)
*H01L 29/00* (2006.01)
*H01L 31/036* (2006.01)

(52) U.S. Cl. ... 438/483; 438/488; 257/65; 257/E21.097; 257/E21.316

(58) Field of Classification Search .......... 438/483
See application file for complete search history.

(56) References Cited

U.S. PATENT DOCUMENTS
2007/0003467 A1   1/2007  Sunkara et al.

OTHER PUBLICATIONS

Iacopi et al, Plasma-enhanced chemical vapour deposition growth of Si nanowires with low melting point metal catalysts: an effective alternative to Au-mediated growth, 2007, Nanotechnology, vol. 18.*
Ferro et al, "VLS growth of SiC epilayers", Research Signpost, Trivandrum, India, ISBN 81-308-0092-6 (2006).

(Continued)

*Primary Examiner* — Andy Huynh
*Assistant Examiner* — Valerie Brown
(74) *Attorney, Agent, or Firm* — Knobbe Martens Olson & Bear LLP (57) ABSTRACT

The present invention provides a method for forming a layer (6) of polycrystalline semiconductor material on a substrate (1). The method comprises providing at least one catalyst particle (4) on a substrate (1), the at least one catalyst particle (4) comprising at least a catalyst material, the catalyst material having a melt temperature of between room temperature and 500° C., or being able to form a catalyst material/semiconductor material alloy with a eutectic temperature of between room temperature and 500° C., and forming a layer (6) of polycrystalline semiconductor material on the substrate (1) at temperatures lower than 500° C. by using plasma enhancement of a precursor gas, thereby using the at least one catalyst particle (4) as an initiator. The present invention furthermore provides a layer (6) of polycrystalline semiconductor material obtained by the method according to embodiments of the present invention.

14 Claims, 5 Drawing Sheets

OTHER PUBLICATIONS

Kim et al., "Ultra-low temperature poly-Si thin film transistor for plastic substrate", Journal of the Korean Physical Society, vol. 48, pp. S6-S63 (2006).

Sharma et al., "Direct synthesis of single-crystalline silicon nanowires using molten gallium and silane plasma; Direct synthesis of single-crystalline silicon nanowires", Nanotechnology, IOP, Bristol, GB, vol. 15, No. 1, pp. 130-134 (Jan. 1, 2004).

Sunkara et al., "Bulk synthesis of silicon nanowires using a low-temperature vapor-liquid-solid method", Applied Physics Letters, vol. 79, No. 10, pp. 1546-1548 (Sep. 3, 2001).

* cited by examiner

| Ia | IIa | toxic-radioactive[1] mid-gap states[2] | used in CMOS[5] Si dopant elements[6] | | | | | | | | | IIIa | IVa | Va | VIa | VIIa | 0 |
|---|---|---|---|---|---|---|---|---|---|---|---|---|---|---|---|---|---|
| H | | unstable metals[3] react with Si[4] | other metals[7] | | | | | | | | | | | | | | He |
| Li | Be | | | | | | | | | | | B | C | N | O | F | Ne |
| Na | Mg | IIIb | IVb | Vb | VIb | VIIb | | VIII | | Ib | IIb | Al | Si | P | S | Cl | Ar |
| K | Ca | Sc | Ti | V | Cr | Mn | Fe | Co | Ni | Cu | Zn | Ga $T_M$~30° | Ge | As | Se | Br | Kr |
| Rb | Sr | Y | Zr | Nb | Mo | Tc | Ru | Rh | Pd | Ag | Cd | In $T_M$~157° | Sn $T_M$~232° | Sb | Te* $T_M$~450° | I | Xe |
| Cs | Ba | La | Hf | Ta | W | Re | Os | Ir | Pt | Au | Hg | Tl $T_M$~230° | Pb $T_M$~327° | Bi $T_M$~271° | Po $T_M$~254° | At | Rn |

FIG. 11

LOW-TEMPERATURE FORMATION OF LAYERS OF POLYCRYSTALLINE SEMICONDUCTOR MATERIAL

CROSS-REFERENCE TO RELATED APPLICATIONS

This application is the national phase under 35 U.S.C. §371 of PCT International Application No. PCT/EP2008/052018 which has an International filing date of Feb. 19, 2008, which designates the United States of America, and which claims the benefit of U.S. Provisional Application No. 60/890,573 filed Feb. 19, 2007, the disclosures of which are hereby expressly incorporated by reference herein in their entirety and are hereby expressly made a portion of this application.

TECHNICAL FIELD OF THE INVENTION

The present invention relates to polycrystalline semiconductor material. More particularly, the present invention relates to a method for forming a layer of polycrystalline semiconductor material on a substrate and to layers of polycrystalline semiconductor material thus obtained.

BACKGROUND OF THE INVENTION

Formation of polycrystalline semiconductor material has been extensively studied over the years.

Conventional ways of making polycrystalline silicon (poly-Si) are, for example, low-pressure chemical vapour deposition (CVD) and solid-phase recrystallization by thermal annealing. These methods require or a high-temperature (higher than 600° C.) deposition or thermal annealing for a long time.

Another way of forming poly-Si is by performing recrystallization using laser annealing. Such a method is described by Do Young Kim et al. in "Ultra-low temperature poly-Si thin film transistor for plastic substrate", Journal of the Korean Physical Society, vol. 48, 2006, pp. S6-S63. In this method, an amorphous silicon (a-Si) film is provided on a substrate by using RF (radio frequency) sputtering at 200 W with an Ar or Xe plasma and at room temperature. The a-Si film is then crystallised by ELA (eximer laser annealing) by using a XeCl laser, for example with post-annealing during 2 hours at 200° C.

The method described by Do young Kim et al. is time consuming and consequently also expensive. Furthermore, laser annealing requires subtle adjustment of spot size and the intensity of laser beams to prepare homogenous poly-Si films.

SUMMARY OF THE INVENTION

It is an object of embodiments of the present invention to provide a method for forming a layer of polycrystalline semiconductor material on a substrate.

A method according to embodiments of the present invention is a low temperature method, which makes it compatible with low temperature processes required for particular applications, for example in the manufacturing processes of semiconductor devices for particular applications.

Furthermore, a method according to embodiments of the invention may be applicable to a large variety of substrate materials such as e.g. semiconductor materials, glass or plastic.

A method according to embodiments of the invention is simple and easy to perform and does not require additional steps for obtaining a layer of good quality, polycrystalline semiconductor material.

The above objective is accomplished by a method according to embodiments of the present invention.

In a first aspect, the present invention provides a method for forming a layer of polycrystalline semiconductor material on a substrate. The method comprises:

providing at least one catalyst particle on the substrate, the at least one catalyst particle comprising at least a catalyst material, the catalyst material having a melt temperature of between room temperature and 500° C. or being able to form a catalyst material/semiconductor material alloy with a eutectic temperature of between room temperature and 500° C., and forming a layer of polycrystalline semiconductor material on the substrate at temperatures lower than 500° C. by plasma enhancement of a precursor gas, thereby using the at least one catalyst particle as an initiator.

A method according to embodiments of the present invention is a low-temperature method which makes it compatible for and thus suitable to be used with low temperature processes required for particular applications, for example for the manufacturing of semiconductor devices for particular applications. The method according to embodiments of the invention is simple and easy to perform and does not, contrary to prior art methods, require additional steps for obtaining a layer of good quality, polycrystalline semiconductor material.

According to embodiments of the invention, the method may furthermore comprise adding $H_2$ to the precursor gas.

The addition of $H_2$ to the precursor gas may increase polycrystallinity of the semiconductor material. Furthermore, addition of $H_2$ to the precursor gas may have an influence on the grain size of the polycrystalline semiconductor material formed. The more $H_2$ is added, the higher the grain size may be.

Forming a layer of polycrystalline semiconductor material on the substrate may be performed at temperatures of between 160° C. and 350° C., for example between 160° C. and 300° C.

The precursor gas may be a gas phase semiconductor material source, for example a silicon source such as e.g. silane ($SiH_4$).

The method may furthermore comprise adding an inert gas to the precursor gas as a carrier gas. The inert gas may, for example, be Ar or Xe or any other suitable inert gas.

Plasma enhancement may make use of a plasma that is a high power plasma, with an RF power of, for example, 20 W.

According to embodiments of the invention the catalyst material may form a catalyst material/semiconductor material alloy with the semiconductor material in which the semiconductor material from the precursor gas has a low solubility of between 0.004 at % and 30 at %, for example between 0.004 at % and 5 at %.

The catalyst material may comprise a group III element, group IV element, group V element, group VI element or an alloy thereof. Specific examples of materials that may be used as a catalyst material according to embodiments of the invention may, for example, be In, Ga, Bi or Sn.

The method may furthermore comprise providing dopant elements in the layer of polycrystalline semiconductor material.

According to embodiments of the invention, the catalyst particle may furthermore comprise at least one dopant element, and providing dopant elements in the layer of polycrystalline semiconductor material may be performed by substantially completely dissolving the at least one dopant element in the polycrystalline silicon during formation thereof.

According to other embodiments of the invention, providing dopant elements in the layer of polycrystalline semiconductor material may be performed by incorporating at least one dopant element in the precursor gas.

According to still further embodiments of the invention, doping of the layer of polycrystalline semiconductor material may be obtained by dissolving at least part of the catalyst material in the layer of polycrystalline semiconductor material during formation thereof.

The plasma may be a direct plasma or a remote plasma.

In a second aspect, the present invention also provides the use of a method according to embodiments of the invention in manufacturing processes of semiconductor devices.

In a third aspect, the present invention also provides a layer of polycrystalline semiconductor material formed on a substrate by using a method according to embodiments of the first aspect of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The dimensions and the relative dimensions do not correspond to actual reductions to practice of the invention.

Moreover, the terms top and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

In one aspect, the present invention provides a method for forming a layer of polycrystalline semiconductor material, for example polycrystalline silicon, on a substrate and layers of polycrystalline semiconductor material, for example polycrystalline silicon, thus obtained.

The method for forming a layer of polycrystalline semiconductor material, for example polycrystalline silicon, on a substrate comprises:
  providing at least one catalyst particle on a substrate, the at least one catalyst particle comprising at least a catalyst material, the catalyst material having a melt temperature of between room temperature and 500° C. or being able to form a catalyst material/semiconductor material alloy with a eutectic temperature of between room temperature and 500° C., and
  forming a layer of polycrystalline semiconductor material on the substrate at temperatures lower than 500° C. by plasma enhancement of a precursor gas, thereby using the at least one catalyst particle as an initiator.

According to embodiments of the invention, the melt temperature of the catalyst material or the eutectic temperature of the catalyst material/semiconductor material alloy may be lower than the temperature at which the layer of polycrystalline semiconductor material is formed. In that way, the catalyst particle may be in liquid form at the time the formation of the polycrystalline semiconductor material occurs and hence, the activation of the VLS mechanism (vapour-liquid-solid growth) may be prompt (see further).

The method according to embodiments of the present invention is a low-temperature method, performed at suitable temperatures below 500° C., which makes it compatible for and thus suitable to be used with low temperature processes required for particular applications, for example for the manufacturing of semiconductor devices for particular applications. With suitable temperatures are meant temperatures suitable for doing semiconductor processing, more particularly suitable for forming a layer of polycrystalline semiconductor material. The suitable temperature may depend on the type of semiconductor and catalyst material involved.

The method according to embodiments of the invention is simple and easy to perform and does not, contrary to prior art methods, require additional steps for obtaining a layer of good quality polycrystalline semiconductor material.

Furthermore, a method according to embodiments of the invention may be applicable with a large variety of substrate materials such as e.g. semiconductor materials, glass or plastic.

Hereinafter the method will be described by means of FIG. 1 and FIG. 2. It has to be understood that this is only by way of explanation and is not intended to limit the invention in any way.

In a first step, a substrate 1 is provided. The substrate 1 comprises at least a surface of a semiconductor material. The substrate 1 may be any suitable substrate known by a person skilled in the art. In embodiments of the present invention, the term "substrate" may include any underlying material or materials that may be used, or upon which a device, a circuit or an epitaxial layer may be formed and of which at least a surface comprises a semiconductor material. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer of semiconductor material is formed, for example a glass or metal layer.

According to embodiments of the invention, the substrate 1 may be a bulk semiconductor substrate. According to embodiments of the invention, the substrate 1 may comprise at least a top surface 3 of a semiconductor material. For example, the substrate 1 may comprise a base part 2 with a top surface layer 3 on top of the base part, the top surface layer 3, for example, being formed of a semiconductor material.

According to embodiments of the invention, the substrate 1 or at least a top surface 3 of the substrate 1 may comprise a same material as the polycrystalline semiconductor material to be formed on the substrate 1. According to other embodiments of the invention, the substrate 1 or at least a top surface 3 of the substrate 1 may comprise a different material than the polycrystalline semiconductor material to be formed on the substrate 1.

Hereinafter, the method will further be described by means of the substrate 1 comprising a base part 2 and a silicon top surface 3 and the polycrystalline semiconductor material to be formed being silicon. It has to be understood that this is not intended to limit the invention in any way and that any other suitable substrate 1 can be used with the method according to embodiments of the present invention.

Figure 1:
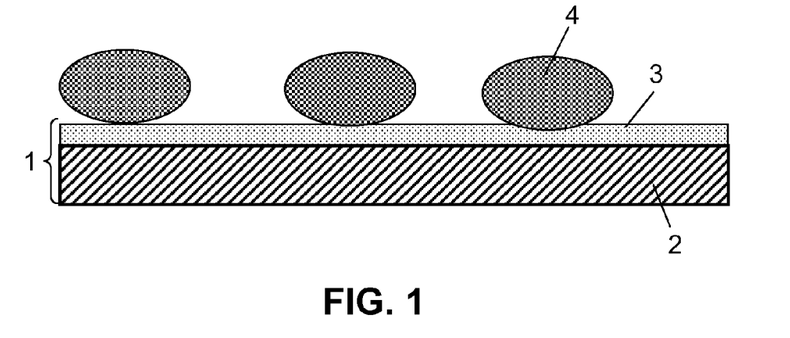
FIG. 1 and FIG. 2 show subsequent steps in a method according to embodiments of the present invention.

Onto the silicon top surface 3 of the substrate 1 at least one catalyst particle 4 is provided (see FIG. 1). The at least one catalyst particle 4 comprises at least a catalyst material, the catalyst material having a low melt temperature of between room temperature and 500° C., for between 100° C. and 300° C., or being able to form a catalyst material/semiconductor material alloy with an eutectic temperature of between room temperature and 500° C. According to embodiments of the invention, suitable catalyst materials may be low melting point metals with a metal-semiconductor phase diagram of the Eutectic type (see further for examples). Suitable catalyst materials may not form intermediate compounds with the semiconductor material, in the example given with silicon. Furthermore, suitable catalyst materials may be able to form a catalyst material/semiconductor material alloy in which the semiconductor material from the precursor gas, e.g. semiconductor material source has a low solubility of below 30 at %, for example below 5%. Hence, summarised it can be stated that suitable catalyst materials which may be used with embodiments of the present invention may have to fulfil one or more of the following requirements:
  they should be compatible with semiconductor technology, e.g. silicon technology, and/or
  they should be thermodynamically favourable for VLS (vapour-liquid-solid) growth, i.e. do not form intermediate compounds with the semiconductor material, have a low melt temperature of between room temperature and 500° C., for example between 100° C. and 500° C. or be able to form a catalyst material/semiconductor material alloy with a eutectic temperature of between room temperature and 500° C., and be able to form a catalyst material/semiconductor material alloy in which the semiconductor material has a low solubility of below 30 at %, for example below 5% (e.g. Ga, In, Tl, Bi, Sn, Cd, Pb or Zn, in case the semiconductor material is Si or Ge).

Figure 3:
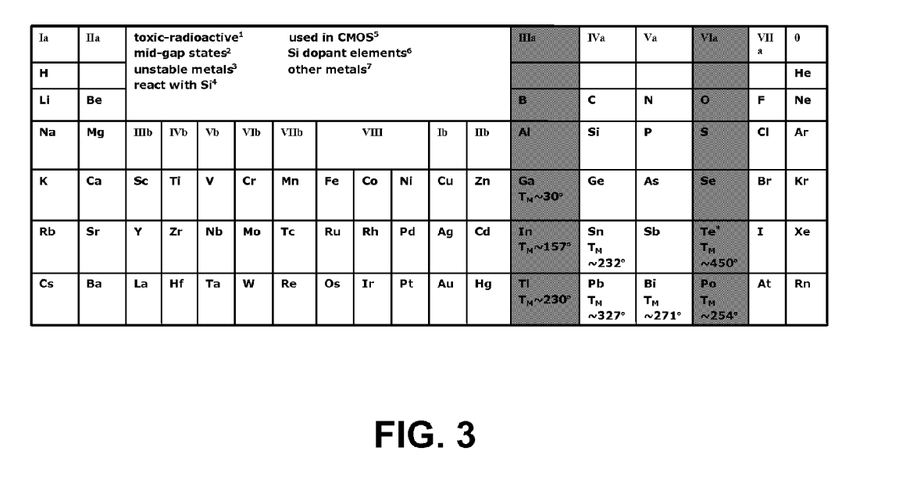
FIG. 3 illustrates suitable materials to be used with a method according to embodiments of the present invention.
Figure 4:
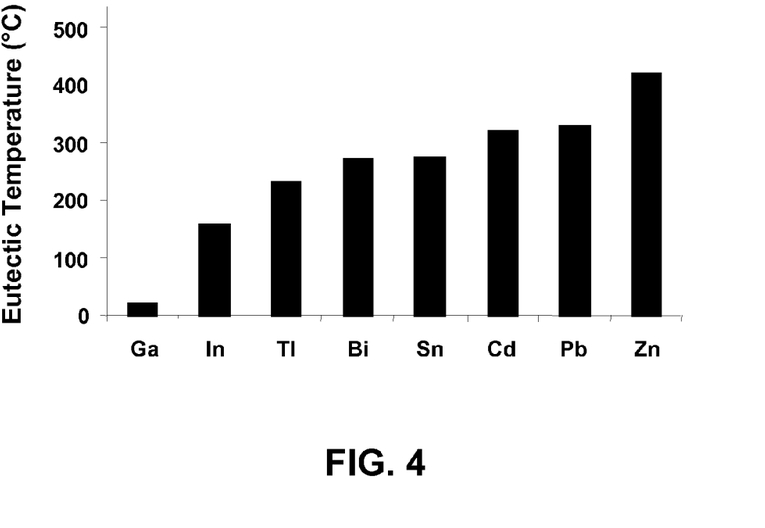
FIG. 4 illustrates the eutectic temperature of different catalyst materials in combination with Si.
Figure 5:
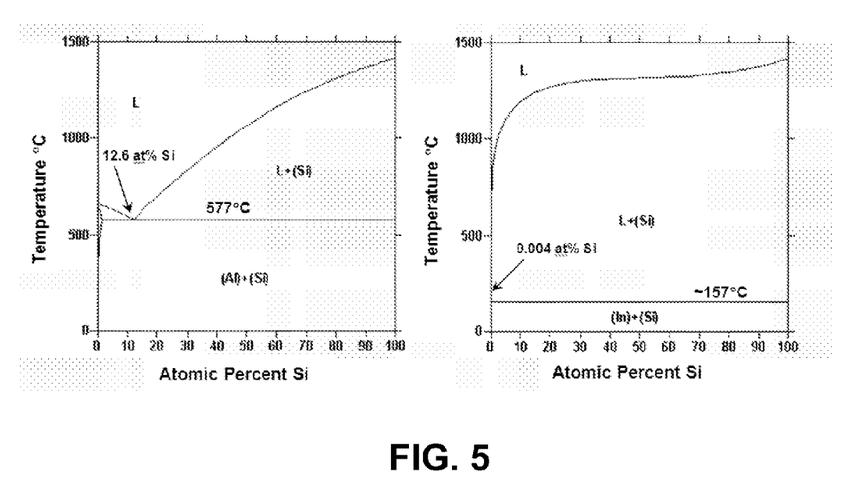
FIG. 5 shows eutectic diagrams for Al—Si alloys (left) and for In—Si alloys (right).

Suitable materials to be used as a catalyst material with the method according to embodiments of the invention may be group III elements, group IV elements, group V elements, group VI elements or alloys thereof. Suitable materials to be used as a catalyst material with embodiments of the present invention are illustrated in FIG. 3 (dashed area). Specific examples of materials that may be used as a catalyst material according to embodiments of the invention may, for example, be In, Ga, Bi or Sn. FIG. 4 illustrates suitable catalyst materials which may, for example, be used in case the semiconductor material is Si or Ge together with the eutectic temperature of material/Si or material/Ge eutectic alloys formed between these materials and Si or Ge. FIG. 5 shows eutectic phase diagrams for Al/Si alloys (left) and for In/Si alloys (right). The Al/Si eutectic alloy has a eutectic temperature of 577° C., which is about 100° C. lower than the melt temperature of Al. This makes Al not a very suitable candidate to be used with a method according to embodiments of the invention. The In/Si eutectic alloy, however, has a eutectic temperature of 175° C. which substantially coincides with the melt temperature of In (160° C.). This makes In a suitable candidate to be used as a catalyst material with a method according to embodiments of the invention. The In/Si eutectic alloy shows an very low Si solubility of about $10^{-8}$ at % and a steep liquidus line, which may indicate that the liquid In/Si alloy is promptly saturated with Si in a wide range of temperatures. The Al/Si alloy shows a higher Si content of about 12.6 at % and a smoother liquidus line. Hence, the Si concentration in the liquid Al/Si alloy in equilibrium with solid Si can be considerably different from the eutectic composition at temperature above the eutectic point.

Figure 2:
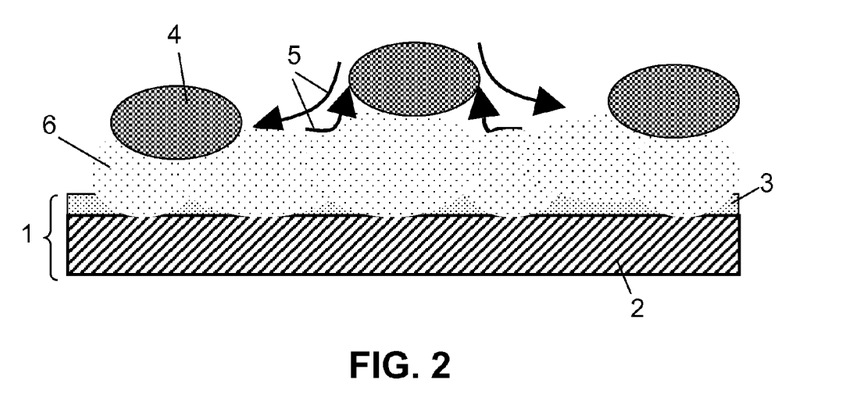

Next, polycrystalline semiconductor material is formed, also referred to as deposited or grown, onto the substrate 1 provided with catalyst particles (see FIG. 2). This is done at temperatures lower than 500° C., for example between 160° C. and 350° C. or between 160° C. and 300° C., using a plasma next to a precursor gas, which may be a high power plasma with an RF (radio frequency) power of between 10 W and 40 W, for example an RF power of 20 W, and a precursor gas as a semiconductor material source providing the semiconductor material in a gas phase. The RF power of the plasma is dependent on the tool that is used and may be determined by e.g. plasma chamber design or by the type of plasma used. The plasma may be a direct plasma, i.e. the substrate 1 may be directly exposed to the plasma, or may be a remote plasma, i.e. the substrate 1 may be located away from plasma, and hence, is not directly exposed to plasma.

The method according to embodiments of the invention uses plasma enhancement (see further). By using a suitable catalyst material as described above, i.e. a catalyst material having a low melt temperature of between room temperature and 500° C., for example between 100° C. and 500° C. or between 100° C. and 300° C., or being able to form a catalyst material/semiconductor material alloy with a eutectic temperature of between room temperature and 500° C., for example between 100° C. and 500° C. or between 100° C. and 300° C., the catalyst material may already be in a liquid form at the time that formation of the layer of polycrystalline semiconductor material starts. Formation of the layer of polycrystalline semiconductor material may be performed during a suitable time period, for example a time period of about 10 min. The time period of formation of the layer of polycrystalline semiconductor material may depend on the deposition rate and the required thickness of the layer of polycrystalline semiconductor material.

The formation of the layer of polycrystalline semiconductor material according to embodiments of the invention may be based on VLS (vapour-liquid-solid) growth. VLS may be used with deposition techniques such as e.g. chemical vapour deposition (CVD), Molecular Beam Epitaxy (MBE) or Pulsed Laser Ablation (PLD).

VLS growth by, for example, CVD may comprise several steps:
  precursor gas transport to the catalyst particle (indicated by arrows 5 in FIG. 2),
  gas dissociation at the particle site,
  optionally a pre-treatment step in-situ with the growth process, e.g. an anneal step at the same temperature as the temperature at which formation of the polycrystalline semiconductor material is performed with or without plasma,
  sticking of semiconductor material, e.g. Si, to and diffusion of semiconductor material, e.g. Si, in the catalyst particle, e.g. metal (Me) particle, thereby forming an alloy, e.g. a liquid Si-Me alloy, and
  super-saturation of the catalyst particle, e.g. metal particle, and 2-dimensional (2D) precipitation of the semiconductor, e.g. Si, crystal.

The precursor gas may be a semiconductor material source. In the example given, where a polycrystalline silicon layer is to be formed, the precursor gas may be a Si-source, e.g. silane ($SiH_4$).

Formation of a polycrystalline semiconductor material layer, in the example given a silicon layer, is obtained when a steady-state condition is reached between the flux of the semiconductor material, e.g. silicon, through the particle and the precipitation of semiconductor material, e.g. Si, on the substrate 1. The rate limiting step is dependent on the type of catalyst material and the growth conditions. In known CVD growth processes the dissociation of the precursor gas, e.g. silane is often reported as a rate limiting step. When, however, plasma enhancement is used as is the case in a method according to embodiments of the invention, catalytic dissociation of molecules of the precursor gas is not required, as already pre-dissociated semiconductor, e.g. Si, species are transported towards the substrate 1 and the catalyst particle 4 because of the plasma that is used.

The key principle behind the VLS mechanism is the transformation of the catalyst particle 4 into a liquid alloy of the catalyst material and the semiconductor compound, e.g. Si. The catalyst particle 4, which is according to embodiments of the invention in liquid form at the temperature at which the formation of the polycrystalline semiconductor material is performed, acts as a privileged site for semiconductor, e.g. Si, deposition, thanks to the higher sticking coefficient of liquid as compared to solid surfaces. In addition, the diffusion kinetics of semiconductor material, e.g. Si, through a liquid metal particle is clearly more favourable than diffusion through a solid particle. The temperature required for the liquid phase transformation of the catalyst particle can be considerably lower than the melting temperature of the catalyst, e.g. metal catalyst, when an alloy is formed with the semiconductor compound, in the example given silicon, with nearly eutectic composition. This effect is particularly evident in case of gold. The Au—Si system has a eutectic temperature of 363° C., which is much lower than the melting temperature of Au which is around 1060° C.

The super-saturation of the liquid catalyst particle, also referred to as droplet, because of the continuous gas phase supply of semiconductor species, e.g. Si species, leads to the precipitation of semiconductor crystals, e.g. Si crystals, at the interface between the liquid catalyst particle and the substrate 1, such that the catalyst particle 4 remains on top of the precipitated structure. This mechanism is also referred to as tip growth. Semiconductor material, e.g. Si, tends to precipitate from the nearly eutectic alloy preferentially in crystalline form at moderate temperatures of lower than 500° C. according to embodiments of the present invention. This phenomenon is also known as metal-induced crystallization. The choice of temperatures of lower than 500° C., for example between 150° C. and 500° C., between 160° C. and 500° C. or between 160° C. and 350° C. or between 160° C. and 300° C., according to embodiments of the present invention, the finite volume of the liquid alloy and the interaction with the substrate 1 help to trigger a 2D growth of crystalline semiconductor material, in the example given silicon, by heterogeneous nucleation.

The catalyst particles may play a key role in almost all the above-mentioned steps of VLS growth by chemical vapour deposition, due to the favourable chemical and physical properties of the noble metal. A conventionally used catalyst material may be gold (Au). Au is also an efficient chemical catalyst for silane dehydrogenation/dissociation. This property is common to a few metals, however it is not strictly necessary for VLS growth. However, gold may not be compatible with Si-technology for some particular applications. Therefore, it is an advantage of the method according to embodiments of the invention that the spectrum of the possible catalysts can be broadened beyond the class of chemical catalysts. The method according to embodiments of the invention uses plasma enhancement for obtaining efficient precursor gas dissociation and bringing semiconductor, e.g. Si, deposition conditions as much as possible towards a gas phase transport-limited regime. In such way, the requirement for chemical catalysis by the catalyst particle 4 is no longer necessary. It has been found that incubation time for the activation of the catalyst particle 4 for the VLS mechanism is a critical parameter for initiating formation of polycrystalline semiconductor material, e.g. silicon, in a gas phase transport-limited regime.

For obtaining a prompt activation of the VLS mechanism, it is advantageous that the catalyst particle 4 is already in liquid form when the growth process of the polycrystalline semiconductor material starts. Thanks to the fast diffusion of semiconductor material such as e.g. Si in the liquid catalyst particle, activation of the VLS mechanism may be prompt.

A suitable example of a catalyst material may be Indium (In). As already described above, In has a eutectic temperature of 157° C., which substantially coincides with its melting temperature 160° C. An In—Si eutectic alloy exhibits a low solubility in Si of $10^{-8}$ at % Si. Indium particles are found to immediately act as a site for polycrystalline Si formation. A main reason therefore is that the catalyst material is already in liquid form when the growth process of the polycrystalline silicon starts, as the process temperature may be higher than the melting temperature of In. The activation of the VLS mechanism is thus prompt, thanks to the fast diffusion of Si from the precursor gas through the already liquid particle. It has to be noted that a Si concentration of slightly above $10^{-8}$ at % in the particle may be sufficient to drive the liquid alloy into super-saturation.

Formation of a layer of polycrystalline semiconductor material following the regime as described above may compete with a parasitic deposition of amorphous semiconductor material, e.g. amorphous silicon (a-Si). In this case the requirements for a selective semiconductor deposition, e.g. Si deposition, become stringent, and a prompt activation of the catalyst particle for VLS growth is crucial. Both thermodynamic and kinetic parameters for forming a super-saturated liquid alloy of semiconductor material, e.g. Si, and the catalyst material play a fundamental role in the incubation time for the activation of the VLS mechanism.

Figure 6:
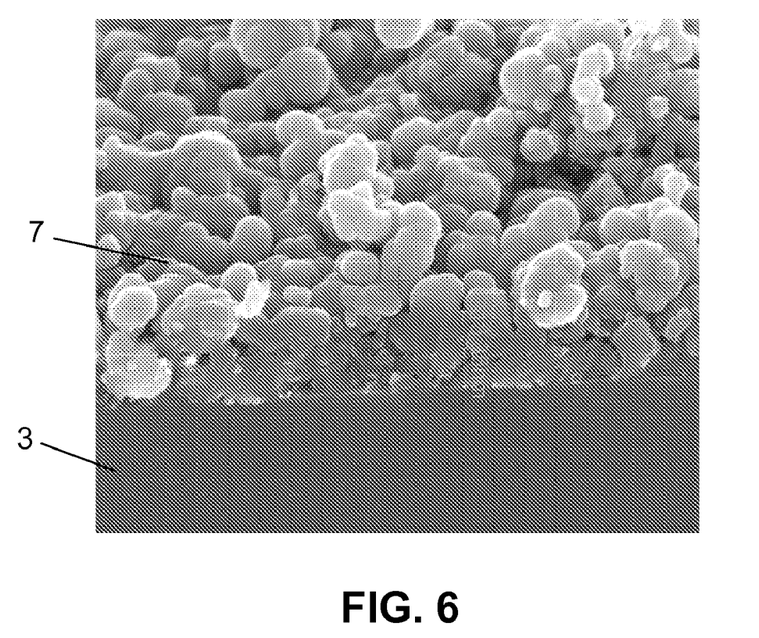
FIG. 6 shows a SEM picture of a layer of polycrystalline silicon formed at a temperature of 500° C. according to an embodiment of the present invention.
Figure 7:
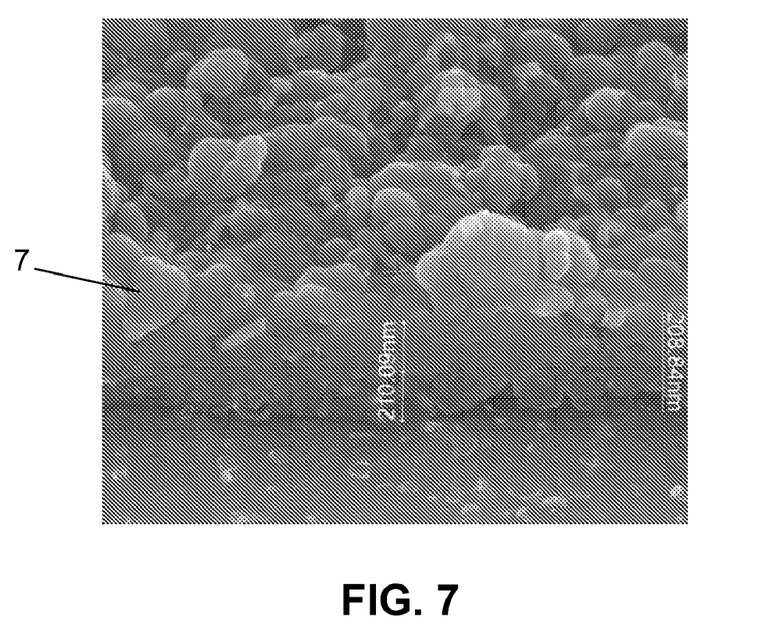
FIG. 7 shows a SEM picture of a layer of polycrystalline silicon formed at a temperature of 400° C. according to an embodiment of the present invention.
Figure 8:
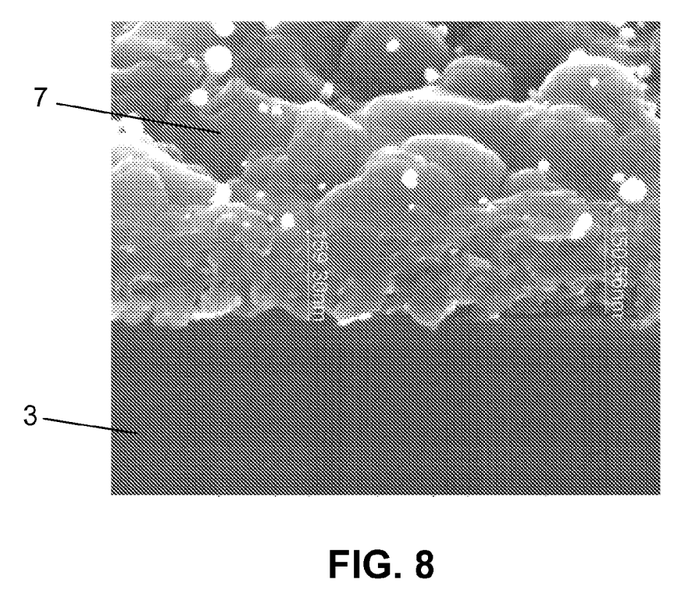
FIG. 8 shows a SEM picture of a layer of polycrystalline silicon formed at a temperature of 300° C. according to an embodiment of the present invention.
Figure 9:
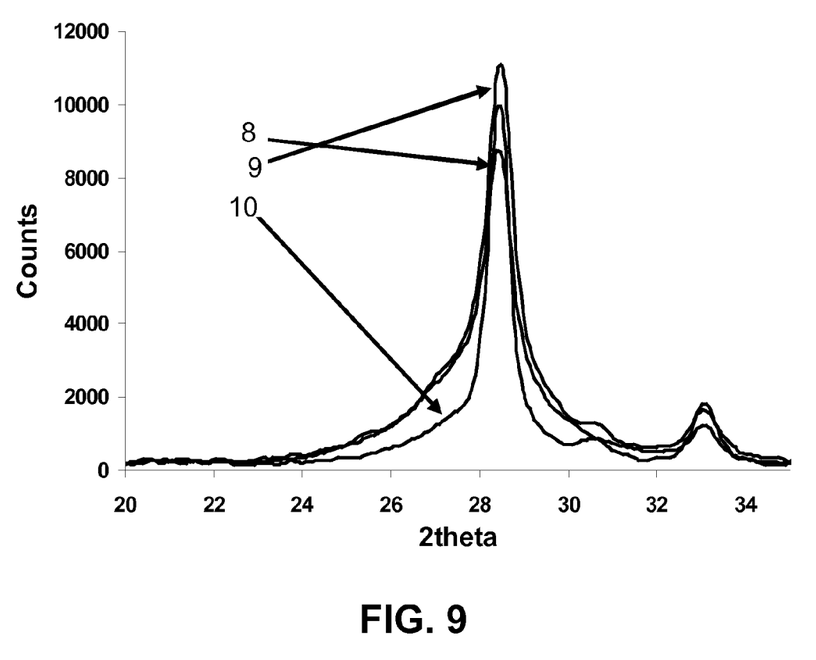
FIG. 9 shows results of XRD measurements on polycrystalline silicon layers formed by a method according to embodiments of the present invention.

The size of the grains in the layer of polycrystalline semiconductor material, e.g. polycrystalline Si, plays an important role for polycrystallinity. As an example, formation of polycrystalline Si performed at different temperatures of 300° C., 400° C. and 500° C. show that the lower the temperature at which the silicon is formed, the better the crystallinity of the semiconductor material formed becomes. This means that the lower the temperature is, the higher the grain size becomes. This is illustrated in FIG. 6 to FIG. 8. FIG. 6 shows a SEM picture of a layer of polycrystalline Si deposited at a temperature of 500° C., FIG. 7 shows a SEM picture of a layer of polycrystalline Si deposited at a temperature of 400° C. and FIG. 8 shows a SEM picture of a layer of polycrystalline Si deposited at a temperature of 300° C., all using a method according to embodiments of the present invention. From these pictures it becomes clear that grain sizes become larger when the temperature decreases. This is also illustrated in FIG. 9 which shows XRD (X-ray diffraction) measurements performed on layers of polycrystalline silicon formed at 500° C. (curve 8—lowest peak), at 400° C. (curve 9—highest peak) and at 300° C. (curve 10—middle peak). From this figures it can be seen that the FWHM (full width at half maximum) is smaller for lower temperatures. This indicates that the grain size of the polycrystalline silicon increases with decreasing deposition temperature.

From the XRD measurements, the grain size may be estimated using the Debye-Scherrer formula:

$$d = \frac{0.9 * \lambda}{\Delta * \cos\theta} \quad (1)$$

wherein d is the grain size, $\lambda$ the wavelength of the X-rays used in the XRD experiment, $\Delta$ the FWHM of the diffraction peak and $\theta$ the angle corresponding to the diffraction peak.

Figure 10:
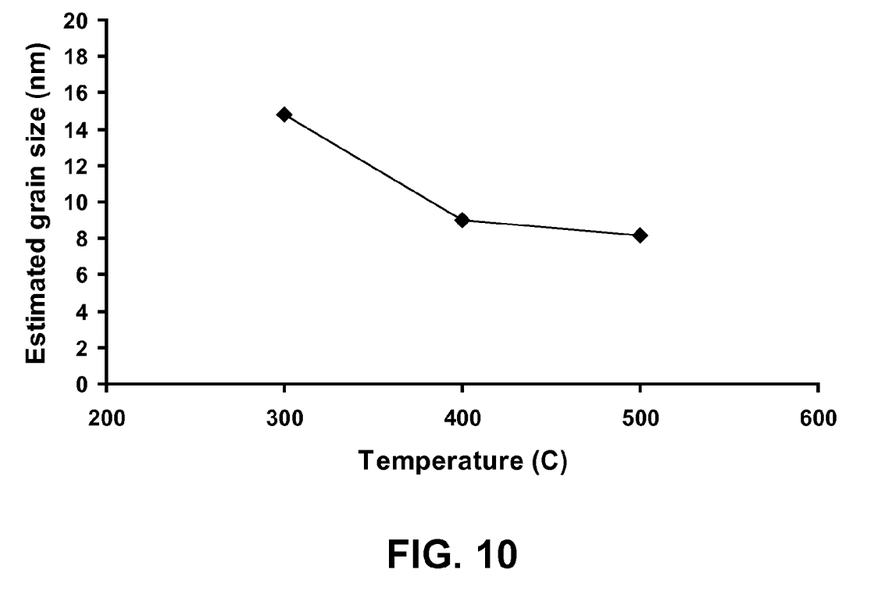
FIG. 10 shows estimated grain sizes for polycrystalline silicon layers obtained with a method according to embodiments of the present invention as a function of the temperature used during formation of the polycrystalline silicon layers.

Grain sizes of approximately 8 nm, 9 nm and 15 nm are estimated by using equation (1) for formation of polycrystalline silicon at respectively 500° C., 400° C. and 300° C. FIG. 10 shows the estimated grain size as a function of the temperature at which the polycrystalline silicon was formed.

Figure 11:
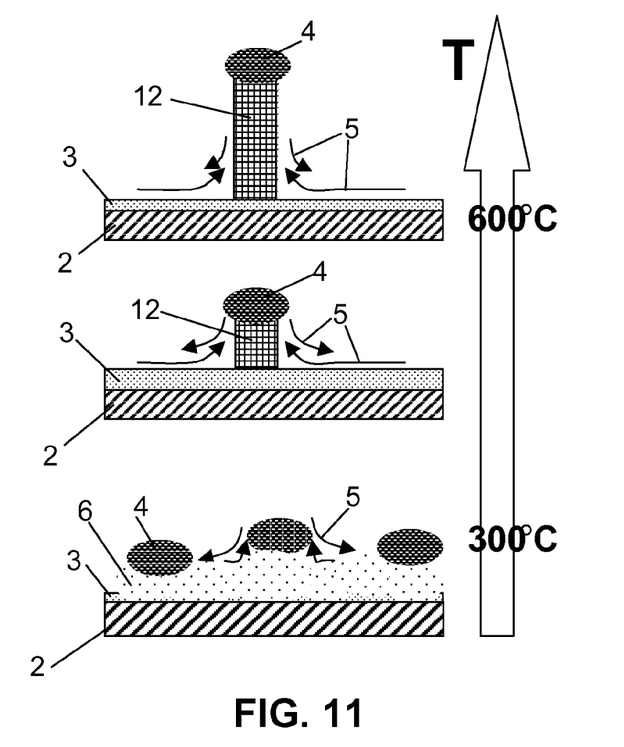
FIG. 11 schematically illustrates limitations of a method according to embodiments of the invention above 500° C.

At temperatures higher than 500° C., it was found that one-dimensional (1D) growth is preferred above 2D growth. In other words, at temperatures of higher than 500° C., no layers of polycrystalline semiconductor material, e.g. silicon, are formed any more but elongated semiconductor nanostructures, e.g. silicon nanostructures, such as silicon nanowires are formed. This is schematically illustrated in FIG. 11 and has been experimentally investigated in case of the semiconductor material being silicon, the catalyst material being Indium by using a direct plasma with an RF power of 20 W, using a catalyst particle density in the order of $10^8$ à $10^9$ particles/cm$^2$ and particles sizes of between 10 nm and 200 nm. FIG. 11 schematically illustrates that at temperatures of higher than 600° C. formation of elongated semiconductor nanostructures, e.g. silicon nanostructures 12 such as silicon nanowires, is very pronounced, meaning that elongated semiconductor nanostructures 12 can be formed with dimensions of between 1 nm and 200 nm, depending on the initial diameter of the catalyst particles 4 used and the time period during which growth is performed. At temperatures of between 500° C. and 600° C. formation of elongated semiconductor nanostructures e.g. silicon nanostructures 12 is not as pronounced as for higher temperatures, but formation of elongated nanostructures 12 or, in other words, 1D growth is still preferred above formation of a layer of polycrystalline semiconductor material or, in other words, above 2D growth. At temperatures of lower than 500° C. formation of a layer of polycrystalline semiconductor material or, in other words, 2D growth, is preferred above formation of elongated semiconductor nanostructures 12 or, in other words, above 1D growth.

Catalyst particles 4 may be provided in a density of, for example, $10^8$ à $10^9$ particles/cm$^2$, with particles having a diameter of between 1 nm and 200 nm. According to embodiments of the invention, also higher densities of catalyst particles 4 may be provided.

Hence, according to embodiments of the invention, the catalyst material, catalyst density and growth conditions, e.g. plasma power, concentration of precursor gas and process temperature may be optimized as described above such that a layer of polycrystalline semiconductor material, e.g. silicon, is formed rather than elongated semiconductor nanostructures such as e.g. nanowires, e.g. silicon nanostructures.

Due to the low solubility of the catalyst material in the semiconductor material and poor wetting of catalyst material with the semiconductor material, e.g. poor wetting of In with Si, the catalyst particle 4, e.g. In particle, may be easily removed after formation of the polycrystalline semiconductor layer 6, e.g. silicon layer. After formation of the polycrystalline semiconductor layer 6 the catalyst particle 4 is situated on top of the polycrystalline semiconductor layer 6 and is thus not dissolved in the layer 6. Hence, the catalyst particle 4 can then easily be removed e.g. by means of a suitable removal step, for example a wet removal step, such as e.g. a wet etch.

According to embodiments of the invention, the method may furthermore comprise addition of $H_2$ to the precursor gas. Addition of $H_2$ has a twofold action. It may promote etching of amorphous semiconductor material, e.g. a-Si, and thus reduce the amount of amorphous semiconductor material, e.g. a-Si, present on the substrate 1, and it also hampers deposition of amorphous semiconductor material, e.g. a-Si deposition, through the formation of H-terminals e.g. Si—H terminals on the surface of the substrate 1. Hence, the addition of $H_2$ to the precursor gas may increase polycrystallinity of the semiconductor material. Furthermore, addition of $H_2$ to the precursor gas may have an influence on the grain size of the polycrystalline semiconductor material formed. The more $H_2$ is added, the higher the grain size may be. $H_2$ may be added in any suitable concentration provided that the partial pressure of the semiconductor precursor does not become lower than 0.05 Torr.

According to further embodiments of the invention, the method may furthermore comprise adding a carrier gas, such as an inert gas, such as e.g. Ar, to the precursor gas, in order to obtain a higher total pressure in the plasma chamber.

According to still further embodiments of the invention, the method may furthermore comprise doping, e.g. homogeneously doping of the polycrystalline semiconductor layer. Doping may be performed during formation of the layer of polycrystalline semiconductor material. For example, to obtain p-type doping the at least one dopant element may be a p-type dopant element and may, for example, be Al or Ga. To obtain an n-type doping, the at least one dopant element may be an n-type dopant element and may, for example, be Sb.

According embodiments of the invention doping may be performed by incorporating dopant elements in the precursor gas, as is known by a person skilled in the art.

According to other embodiments of the invention, doping may be performed by providing catalyst particles which comprise, next to the catalyst material, at least one dopant element. The at least one dopant element serves for doping the polycrystalline semiconductor material during growth by substantially completely dissolving in the polycrystalline semiconductor material. With "substantially completely dissolving" is meant that more than 90% of the at least one dopant element, for example more than 95% of the at least one dopant element or more than 99% of the at least one dopant element is dissolved in the polycrystalline semiconductor layer obtained.

According to these latter embodiments, a homogeneous doping may be obtained. Furthermore, with this latter method it is possible to obtain low dopant concentrations, for example a dopant concentration of lower than $10^{17}$ atoms/cm3, in the layer of polycrystalline semiconductor material. The dopant concentration may be determined by the speed of growing of the polycrystalline semiconductor layer because the segregation coefficient of dopant elements upon growth from a liquid phase is most of the time growth-rate dependent.

A further way to obtain a doped polycrystalline semiconductor material may be by choosing a catalyst material that at least partially dissolves in the semiconductor material during formation of the layer of polycrystalline semiconductor material.

EXAMPLE

According to an example, Indium (In) may be used as a catalyst material. In has a melt temperature of 160° C. and is thus in liquid form at a temperature of 300° C. which is used in this experiment for forming the layer 6 of polycrystalline silicon.

The formation of a polycrystalline silicon layer was performed using VLS growth in a CVD chamber with a direct RF plasma source as described above by using the following recipe:

1) Deposit catalyst particles 4 at a density in the order of $10^8$ à $10^9$ particles/cm$^2$, the particles having a diameter of between 1 nm and 200 nm,
2) heat up for 2 minutes, 300° C.,
3) $H_2$-preclean, 200 sccm, P=1000 mTorr, RF=100 W, 1 minute
4) Pump down to 10 mTorr,
5) Plasma deposition
   a. $SiH_4$=20 sccm, $H_2$=10 sccm, Ar=10 sccm (2:1:1)
   b. P=500 mtorr
   c. RF=20 W
   d. T=300° C.
   e. Time=10 min
6) Pump down to 10 mTorr For experiments, the following settings of the CVD chamber have been used: 200 mm wafer direct plasma chamber, cold-wall reactor, RF 13.56 MHz, 0.02-0.1 W/cm2 power density range, spacing between top (RF) and bottom (wafer stage) electrode: 20 mm. Of course the settings are device dependent.

Results of this experiment are shown in FIG. 8 and FIG. 9 (curve 10). Grain sizes of approximately 15 nm were obtained as was already described above.

Because of the addition of $H_2$ in the $SiH_4$/Ar mixture in a 2:1:1 ratio, the formation of a-Si may be reduced as was discussed above.

Due to the poor wetting of In with Si (contact angle at room temperature >100°, the In catalyst particle may be easily removed after formation of the polycrystalline silicon layer. After formation of the polycrystalline silicon layer 6 the In catalyst 4 is situated on top of the layer 6 and is not dissolved in the layer 6. Hence, the In catalyst 4 can be easily removed e.g. by means of a wet removal step, e.g. wet etch.

It is to be understood that although preferred embodiments, specific constructions and configurations, as well as materials, have been discussed herein for devices according to the present invention, various changes or modifications in form and detail may be made without departing from the scope of this invention as defined by the appended claims. For example, as described above, the method according to embodiments of the invention may also be used for forming layers of polycrystalline semiconductor material other than silicon, such as e.g. Ge or SiGe. The method may also be used for obtaining layers of other polycrystalline semiconductor material such as e.g. III-V semiconductor material (e.g. GaAs, InP).

The invention claimed is

1. A method for forming a layer of polycrystalline semiconductor material on a substrate, the method comprising:
   providing at least one catalyst particle on a substrate, wherein the at least one catalyst particle comprises a catalyst material; and
   forming a layer of polycrystalline semiconductor material on the substrate at a temperature lower than 500° C. by plasma enhancement using a precursor gas comprising a gas phase semiconductor material source, wherein the at least one catalyst particle acts as an initiator for formation of the layer of polycrystalline semiconductor material, wherein the catalyst material forms an alloy with the semiconductor material, the alloy having a eutectic temperature of from room temperature to 500° C., and wherein the semiconductor material has a solubility of below 30 wt. % in the alloy.

2. The method according to claim 1, wherein the precursor gas further comprises $H_2$.

3. The method according to claim 1, wherein forming a layer of polycrystalline semiconductor material on the substrate is performed at a temperature of from 160° C. to 350° C.

4. The method according to claim 1, wherein the precursor gas consists essentially of a gas phase semiconductor material source.

5. The method according to claim 1, wherein the precursor gas further comprises an inert gas.

6. The method according to claim 1, wherein the plasma enhancement makes use of a plasma that is a high power plasma.

7. The method according to claim 1, wherein the semiconductor material has a solubility of from 0.004 wt. % to 30 wt. % in the alloy.

8. The method according to claim 1, further comprising providing dopant elements in the layer of polycrystalline semiconductor material.

9. The method according to claim 8, wherein the catalyst particle further comprises at least one dopant element, wherein providing dopant elements is performed by substantially completely dissolving the at least one dopant element in the polycrystalline semiconductor material during formation thereof.

10. The method according to claim 9, wherein the semiconductor material is silicon.

11. The method according to claim 9, wherein providing dopant elements is performed by incorporating at least one dopant element in the precursor gas.

12. The method according to claim 1, wherein plasma enhancement produces a plasma, and wherein the plasma is a direct plasma or a remote plasma.

13. Use of the method according to claim 1 in a process of manufacturing a semiconductor device.

14. A layer of polycrystalline semiconductor material formed on a substrate by the method according to claim 1.

* * * * *